United States Patent [19]

Koike et al.

[11] 4,426,577

[45] Jan. 17, 1984

[54] ELECTRON MICROSCOPE OF SCANNING TYPE

[75] Inventors: Hirotami Koike, Tokyo; Hideaki Kyogoku, Kanagawa; Masaru Watanabe, Mitaka, all of Japan

[73] Assignee: International Precision Incorporated, Tokyo, Japan

[21] Appl. No.: 234,790

[22] Filed: Feb. 17, 1981

[30] Foreign Application Priority Data

Feb. 15, 1980 [JP] Japan .................................. 55-16534

[51] Int. Cl.³ ............................................ H01J 37/28
[52] U.S. Cl. .................................... 250/310; 250/397
[58] Field of Search .......... 250/310, 311, 397, 396 ML

[56] References Cited

U.S. PATENT DOCUMENTS 2,749,464  6/1956  Le Poole ..................... 250/396 ML
3,107,297 10/1963  Wittry ................................. 250/310
3,329,813  7/1967  Hashimoto ......................... 250/310
3,597,607  8/1971  Campbell et al. ................... 250/310
3,628,014 12/1971  Grubic, Jr. .......................... 250/310
3,845,305 10/1974  Liebl .................................. 250/310
4,121,100 10/1978  Kubozoe et al. ............ 250/396 ML Primary Examiner—Alfred E. Smith
Assistant Examiner—Carolyn E. Fields
Attorney, Agent, or Firm—Lane, Aitken & Kananen

[57] ABSTRACT

An electron microscope of scanning type comprises first and second detectors for detecting secondary electrons emitted from a specimen irradiated by a scanning electron beam are disposed across the magnetic field of an objective lens of an electron-optical system of the microscope. The detection signals obtained from the outputs of both detectors are subjected to simultaneous signal processings.

5 Claims, 6 Drawing Figures

ELECTRON MICROSCOPE OF SCANNING TYPE

BACKGROUND OF THE INVENTION

1. Field of the Invention

The present invention generally relates to an electron microscope of scanning type. In particularly, the present invention concerns an improvement on detecting means for detecting secondary electrons emitted from a specimen in an electron-optical system of the scanning type electron microscope.

2. Description of the Prior Art

For having a better understanding of the invention, description will first be made on the scanning type electron microscope to which the invention can be applied as well as typical examples of the hitherto known secondary electron detecting means. FIG. 1 shows a general arrangement of the scanning type electron microscope in a vertical sectional view. Referring to the figure, electron flux emitted by an electron gun 1 is converged by means of convergence lenses 2 and 3 to an electron beam which is then deflected by scanning coils 4 and 5 so as to perform a two-dimensional scanning. The electron beam having passed through an objective lens 6 is focused upon a specimen 8 disposed on a specimen table 7 for the two-dimensional scanning thereof. Disposed in the vicinity of the specimen table or platform 7 is a secondary electron detector 9 which is adapted to detect secondary electrons emitted from the specimen 8 upon impingement of incident electrons. The detection signal output from the detector 9 is amplified and thereafter utilized for producing an image of the scanned specimen 14 on a screen of a cathode ray tube or Braun tube in synchronism with the scanning of the specimen with the electron beam. Reference numerals 10 and 11 denote apertures of the converging lenses 2 and 3, respectively, and numeral 12 designates an aperture for the objective lens 6.

In connection with the scanning type electron microscope of the structure outlined above, it is known that when a working distance w, i.e. a distance between a bottom plane 13 of the lower magnetic pole of the objective lens 6 and a top surface 14 of the specimen 8 is short, aberrations of the objective lens 6 are reduced, whereby the resolving power or resolution of the scanning type microscope is enhanced. However, when the working distance w is selected sufficiently short for the specimen 8 to be located within the magnetic field of the objective lens 6, at least a part of the secondary electrons emitted from the specimen 8 upon irradiation by the incident electron probe or beam will then be trapped in the magnetic field of the objective lens 6, as the result of which difficulty is encountered in detecting the secondary electrons with a reasonable efficiency by means of the secondary electron detector 9 which is positioned at a height lower than the bottom plane 13 of the lower pole of the objective lens 6, involving a serious problem.

As an attempt to solve the problem described above, it has been already proposed that an electrode 15 of funnel-like configuration is disposed in the vicinity of the specimen 8, wherein a voltage is directly applied to the specimen 8 with a positive potential being imparted to the electrode 15 so that a predetermined voltage difference makes appearance between the specimen 8 and the electrode 15, as is illustrated in FIG. 2. With such arrangement, the secondary electrons emitted from the specimen 8 is forcively caused to travel toward the secondary electron detector 9 under the action of the funnel-like electrode 15.

As another attempt to eliminate the afore-mentioned difficulty, there is known a proposal according to which the secondary electron detector 9 is positioned above the objective lens and the specimen 8 is intentionally disposed within the magnetic field of the objective lens 6 so that the secondary electrons S can be detected by the detector 9, as is shown in FIG. 3. With this arrangement, an image of the specimen can certainly be produced with an improved resolution.

However, the hitherto known arrangements of the secondary electron detecting means described above suffer many shortcomings. For example, in the case of the structure shown in FIG. 2, the range in which the specimen 8 is allowed to be tilted and/or displaced through a fine adjusting device (not shown) for manipulation of the specimen 8 is much restricted due to the necessary disposition of the funnel-like electrode 15 in the vicinity of the specimen 8. Further, there remains little freedom of selecting the positions at which detectors 16 and 17, which detect, for example, reflected electrons B and X-ray X as shown in FIG. 3, are to be installed, in addition to the detector 9. On the other hand, in the case of the arrangement shown in FIG. 3, a great deal of restriction is imposed on the size of the specimen itself as well as the range in which the specimen can be inclined and/or displaced, because the specimen 8 is disposed in the magnetic field of the objective lens 6.

SUMMARY OF THE INVENTION

An object of the present invention is to eliminate the aforementioned disadvantages of the hitherto known secondary electron detecting means of the scanning type electron microscope.

Another object of the present invention is to provide an improve structure of the scanning type electron microscope in which the secondary electrons emitted from a specimen can be detected with high certainty and reliability independently of magnitude of the working distance defined hereinbefore without imposing any substantial restriction to the size of specimen and manipulatability thereof.

In view of the above and other objects which will become apparent as description proceeds, it is proposed according to a general aspect of the invention that first and second detectors for detecting secondary electrons are disposed across the magnetic field of the objective lens at opposite sides relative to the latter, wherein detection signals produced from the paired secondary electron detectors are simultaneously processed by means of adder or the like signal processing circuits for subsequent utilization in obtaining a secondary electron image.

DETAILED DESCRIPTION OF THE PREFERRED EMBODIMENTS

Now, the invention will be described in detail in connection with the preferred embodiments thereof by referring to FIGS. 4 to 6 of the accompanying drawings.

Figure 4:
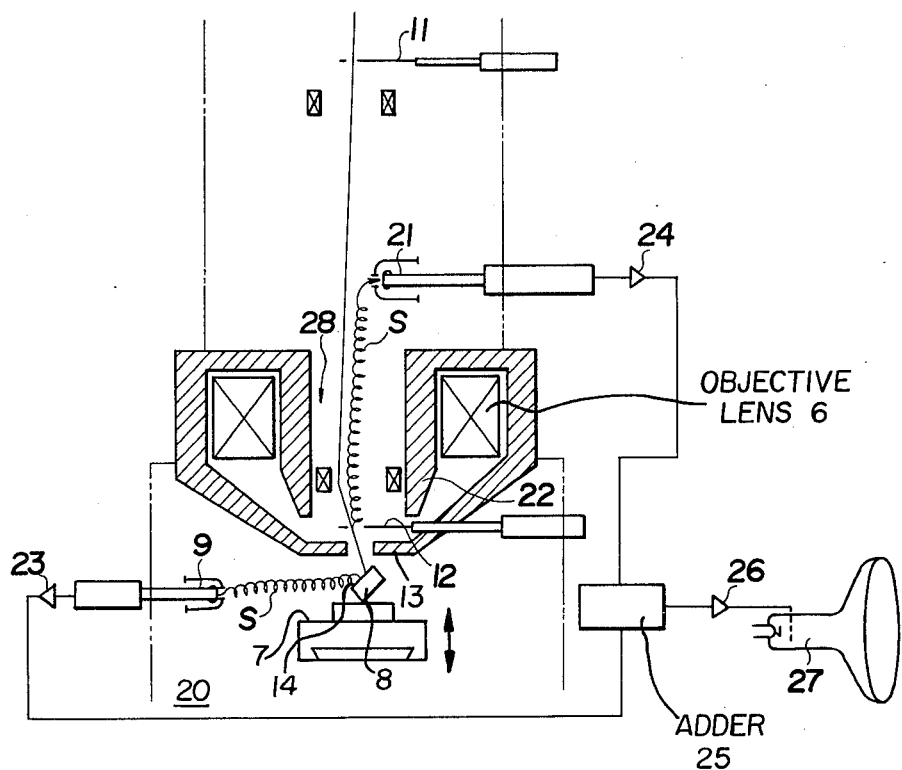
FIG. 4 is a longitudinal sectional view showing an electron microscope of scanning type according to an embodiment of the invention.

Referring to FIG. 4 which shows in a vertical sectional view the scanning type electron microscope according to an embodiment of the invention, there is formed below an objective lens 6 a specimen chamber 20 in which a specimen table (not shown) for supporting thereon a specimen 8 is disposed. A pair of detectors 9 and 21 for detecting secondary electrons S are disposed across the magnetic field of the objective lens with one of the detectors being positioned above the magnetic field of the objective lens 6 while the other is located below the magnetic field, as viewed in a vertical direction. More particularly, the first detector 9 for detecting the secondary electrons is located below the lower pole face 13 of the objective lens 6 in the vicinity of the specimen 8. An output signal produced from the first detector 9 is represented by a solid line curve 33 shown in FIG. 5. On the other hand, the second detector 21 for detecting the secondary electrons is disposed above and adjacent to the upper magnetic pole 22 of the objective lens 6. The output signal available from the second detector 21 is represented by a single-dotted broken line curve 34 in FIG. 5.

The outputs signals 33 and 34 produced from these secondary electron detectors 9 and 21, respectively, are, after having been amplified through respective amplifiers 23 and 24, applied to the imputs of an adder 25 which functions by cooperating with an amplifier 26, as a means for simultaneously processing the output signals 33 and 34 from the detectors 9 and 21. A combined signal output from the adder 25 which is represented by a double-dotted broken line curve 35 in FIG. 5 is amplified through an amplifier 26 and subsequently processed so as to produce an image of the specimen 8 on a screen of a cathode ray tube 27 in synchronism with the scanning of the specimen 8 with the electron beam.

Figure 5:
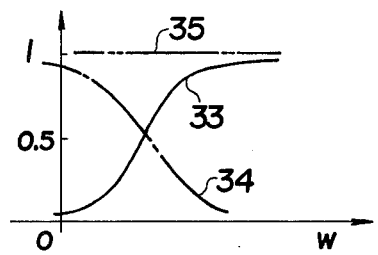
FIG. 5 illustrates graphically relationships between the length of the working distance (w) and magnitudes or intensities of output detection signals from first and second secondary electron detectors.
Figure 6:
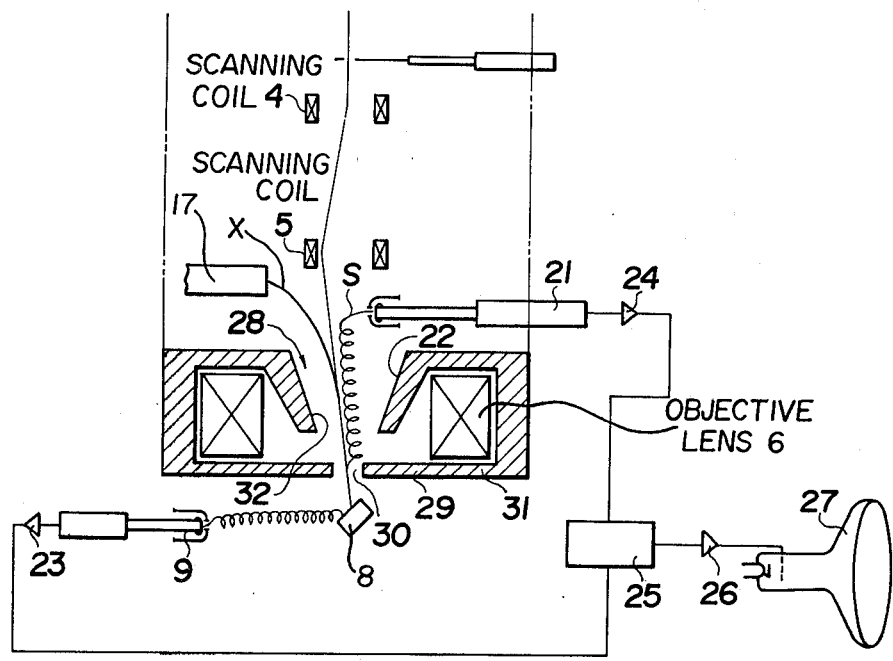
FIG. 6 illustrates another exemplary embodiment of the invention.

In the scanning type electron microscope of the structure described above, a major portion of the secondary electrons S emitted from the specimen 8 will be sensed by the first secondary electron detector 9 as illustrated in FIG. 5 when the working distance w defined hereinbefore is set long. On the other hand, when the working distance w is shortened by placing the specimen table nearer to the lower pole face 13 of the objective lens 6 with a view to obtaining the secondary electron image of high resolution, a part of the secondary electrons S emitted from the specimen 8 is detected by the first secondary electron detector as the output signal 33, while the remaining secondary electrons will be trapped in the magnetic field of the objective lens 6 and caused to travel upwardly through a bore 28 formed in the upper magnetic pole 22 along a principal axis of the objective lens 6 to be finally detected by the second detector 21 which then produces the output signal 34 (refer to FIG. 5). Since both the output signals 33 and 34 produced from the detectors 9 and 21 are added together by means of the adder 25 the combined detection signal 35 of predetermined magnitude or intensity such as shown in FIG. 5 by a double-dotted broken line (35). Further, when the specimen 8 is positioned so as to lie in the magnetic field of the objective lens 6, i.e. when the working distance w takes a negative value, a major portion of the secondary electrons S emitted from the specimen 8 is trapped within the magnetic field of the objective lens 6 and moved vertically upwardly along the principal axis of the lens 6 to be ultimately sensed by the second detector 21. In this manner, substantially all of the the secondary electrons S emitted from the specimen are detected by the first and the second secondary electron detectors 9 and 21 independently from the length of the working distance w.

Figure 1:
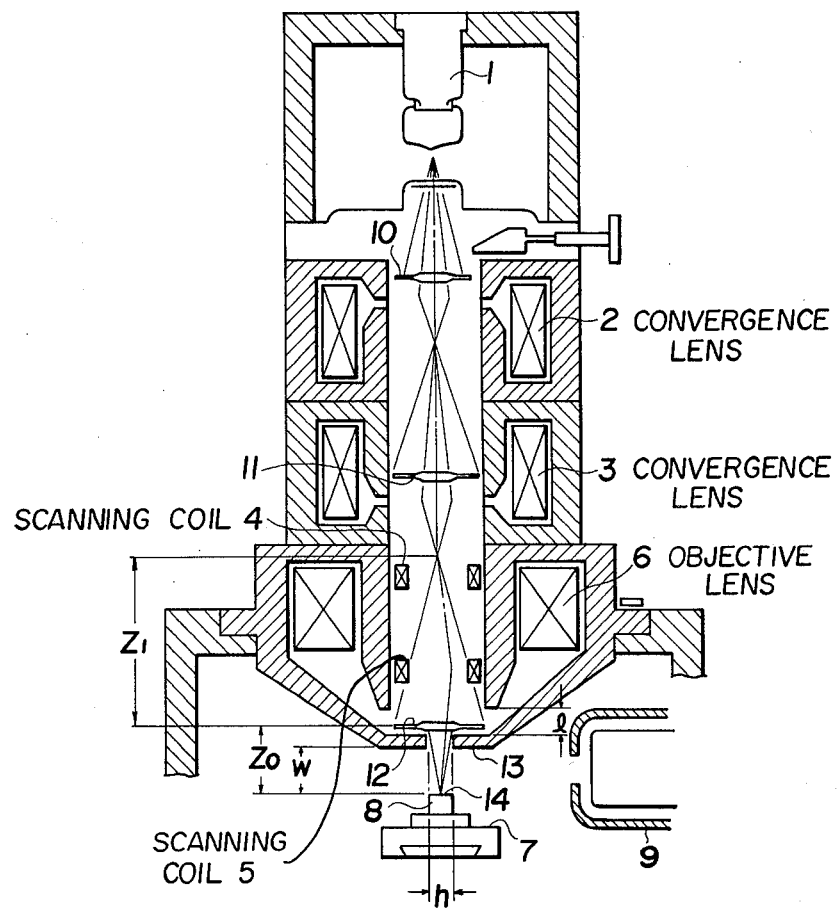
FIG. 1 shows in a longitudinal sectional view a basic structure of an electron microscope of scanning type.
Figure 2:
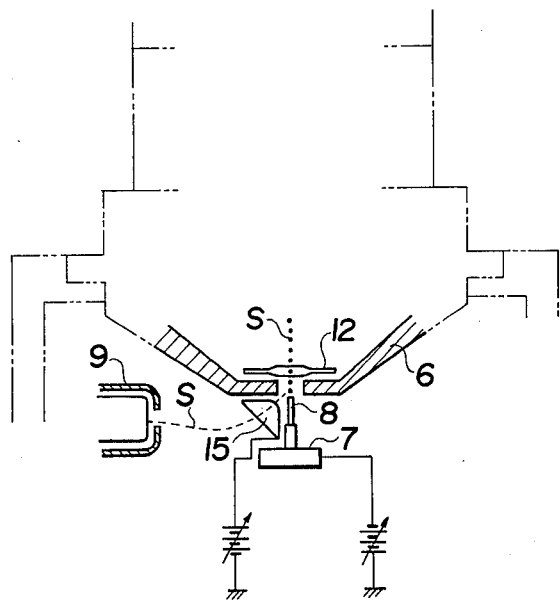
FIG. 2 is to illustrate a hitherto known arrangement for detecting secondary electrons emitted from a specimen.
Figure 3:
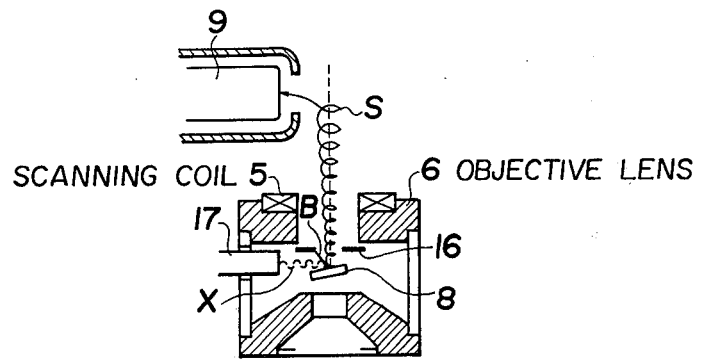
FIG. 3 shows another conventional secondary electron detecting means.

In order to produce a secondary electron image of high resolution, it is required that the spherical aberration coefficient Cs be decreased as small as possible. In this connection, it is to be noted that the structure of the electron microscope being described allows the spherical aberration coefficient Cs to be significantly decreased. More specifically, the spherical aberration Cs of the objective lens 6 may be given by the following approximate expression;

$$Cs = \frac{Zo^3}{4d^2}\left(1 + \frac{Zo}{Z1}\right) \quad (1)$$

where Zo represents a distance between the center of the objective lens 6 and the top surface 14 of the specimen 8 (refer to FIG. 1), Z1 represents a distance between the center of the objective lens 6 and a crossover point of the convergence lens 3 of the final stage (refer to FIG. 1), and d represents a half-amplitude level of the magnetic field on the principal axis of the objective lens 6 which is determined as a function of an inter-pole distance l (FIG. 1) of the objective lens 6 and diameter h of the bore constituting the passage for the electron beam. As can be seen from the above expression (1), when the working distance w remains constant, the distance Zo is also constant. Under the conditions, the spherical aberration coefficient Cs is decreased, as the half-amplitude level d is increased. The increasing of the half-amplitude level d in turn is attained by increasing correspondingly the inter-pole distance l and the bore diameter h. In other words, by increasing the inter-pole distance l of the objective lens 6 as well as the bore diameter h of the lower magnetic pole 29, the spherical aberration coefficient Cs of the objective lens 6 can be decreased. In this case, the magnetic field of the objective lens 6 will enter at least partially the specimen chamber 20 through the bore 30 formed in the lower magnetic pole 29 of objective lens 6. However, since those of the secondary electrons emitted from the specimen 8 which are trapped within the magnetic field of the objective lens 6 are caused to move upwardly along the principal axis of the objective lens 6 through the bore 28 formed in the upper magnetic pole 19 to be ultimately caught by the second secondary electron detector 21, there will arise no degradation in the over all efficiency of detection of the secondary electrons S under the influence of the magnetic field bulging into the specimen chamber 20.

In certain applications such as X-ray analysis or the like, a probe current is required to be increased, which results in that the angle of incidence of the electron beam to the objective lens 6 is correspondingly increased. However, in the case of the scanning type electron microscope according to the embodiment of the invention described above, the electron probe impinging on the top surface 14 of the specimen 8 can be restricted with reliability even when the angle of incidence of the electron beam to the objective lens 6 is large, because the spherical aberration coefficient Cs can be decreased, as described above. Thus, the performance of the electron microscope according to the invention can be enhanced even for applications such as X-ray analysis.

Next, a second exemplary embodiment of the invention will be described by referring to FIG. 6. Also in the second embodiment, a pair of the first and second secondary electron detectors 9 and 21 are disposed across the magnetic field of the objective lens 6 at opposite sides relative to the magnetic field in the same manner as in the case of the first embodiment described above in conjunction with FIGS. 4 and 5. The former however differs from the latter in respect that a casing 31 constituting the magnetic pole pieces 22 and 29 of the objective lens 6 is implemented in a reduced size as viewed in the vertical direction. The bore 28 formed in the upper magnetic pole piece 22 of the objective lens 6 is flared upwardly so as to present a tapered face 32. An X-ray detector 17 is provided at a position adjacent to the bore 28 of the upper magnetic pole 22. Reference numerals 4 and 5 denote scanning coils disposed above the second secondary electron detector 21.

With the structure of the scanning type electron microscope according to the second embodiment of the invention, the detection of the secondary electrons S can be effected with high reliability and accuracy comparable to those of the electron microscope according to the first embodiment of the invention. Besides, the X-ray detector is allowed to be disposed adjacent to the specimen 8. Further, a major portion of X-rays emitted from the specimen 8 travels in the direction substantially orthogonal to the top surface of the specimen and passes through the bore 28 formed in the upper pole piece 22 to be detected by the X-ray detector with high reliability, whereby the X-ray analysis can be effected with a significantly improved efficiency.

In the foregoing description, it has been assumed that the secondary electron detection signals produced from the first and the second detectors 9 and 21 are combined through the adder 25 prior to further signal processings. However, the invention is not restricted to such circuit arrangement. Other arithmetic units may be employed for carrying out signal processings in desired manner.

It has now been appreciated that the detection of the secondary electrons emitted from a specimen in the scanning type electron microscope can be accomplished with an improved reliability to allow the secondary electron image to be produced with an increased resolution by virture of such arrangement that a pair of secondary electron detectors are disposed across the magnetic field of the objective lens at opposite sides, respectively, so that those secondary electrons which are trapped in the magnetic field of the objective lens 6 and thus has evaded capture by one detector can be detected by the other detector, whereby the output signals from both detectors are combined to be utilized in signal processings and evaluations for producing the so-called secondary electron image.

What is claimed is:

1. In an electron microscope comprising an electron optical system including an objective lens, means for irradiating a specimen to be examined with a scanning electron beam, and means enabling the distance between the objective lens and said specimen to be changed, the improvement comprising means for detecting secondary electrons emitted from said specimen irradiated by said scanning electron beam, said means comprising a pair of first and second detectors, said first and second detectors being disposed on opposite sides of the magnetic field of said objective lens, and means for simultaneously processing the output signals of said detectors.

2. A scanning type electron microscope as set forth in claim 1, wherein said objective lens has an upper magnetic pole piece having a bore for allowing the scanning electron beam to pass therethrough, said bore being flared upward and wherein said electron microscope further includes an X-ray detector disposed above said upper magnetic pole piece in the vicinity of said flared bore.

3. A scanning type electron microscope as set forth in claim 1, wherein said first and second detectors are disposed on opposite sides of the median cross-sectional plane of said objective lens.

4. A scanning type electron microscope comprising in a vertical array an electron gun for producing electrons, a convergence lens system for converging the electrons into an electron beam, an objective lens having upper and lower magnetic poles positioned in opposition to each other, a scanning coil system for scanning a specimen with the electron beam, said specimen being disposed below said lower magnetic pole, and means enabling the distance between said specimen and the lower magnetic pole to be changed, a first detector disposed below said lower magnetic pole and said objective lens in the vicinity of said lower magnetic pole, a second detector disposed above said upper magnetic pole and said objective lens in the vicinity of said upper magnetic pole, means connected to the outputs of said first and second detectors for combining the respective output signals of said first and second detectors into a combined signal and means for processing said combined signal to produce an image of said specimen on a display device in synchronism with the scanning of said specimen with said electron beam.

5. A scanning type electron microscope as set forth in claim 4, wherein second detector detects secondary electrons which are trapped in the magnetic field of said said objective lens and caused to move upward along the principle axis of said objective lens.

* * * * *